United States Patent
Chen et al.

(10) Patent No.: US 12,237,027 B2
(45) Date of Patent: Feb. 25, 2025

(54) ANTI-FUSE MEMORY

(71) Applicant: United Microelectronics Corp., Hsinchu (TW)

(72) Inventors: Chung-Hao Chen, Taoyuan (TW); Chi-Hsiu Hsu, Hsinchu County (TW); Chi-Fa Lien, Hsinchu (TW); Ying-Ting Lin, Hsinchu County (TW); Cheng-Hsiao Lai, Chiayi County (TW); Ya-Nan Mou, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 215 days.

(21) Appl. No.: 17/966,881

(22) Filed: Oct. 16, 2022

(65) Prior Publication Data
US 2024/0071535 A1    Feb. 29, 2024

(30) Foreign Application Priority Data
Aug. 29, 2022    (CN) .......................... 202211042656.0

(51) Int. Cl.
G11C 17/16    (2006.01)
G11C 16/04    (2006.01)
G11C 16/24    (2006.01)

(52) U.S. Cl.
CPC .......... *G11C 17/16* (2013.01); *G11C 16/0433* (2013.01); *G11C 16/24* (2013.01)

(58) Field of Classification Search
CPC ..... G11C 17/16; G11C 16/0433; G11C 16/24; G11C 17/18

USPC ....................................................... 365/225.7
See application file for complete search history.

(56) References Cited

U.S. PATENT DOCUMENTS

| | | | |
|---|---|---|---|
| 6,671,040 B2 | 12/2003 | Fong et al. | |
| 8,283,731 B2 | 10/2012 | Luan | |
| 9,224,496 B2 | 12/2015 | Chung | |
| 2013/0292847 A1* | 11/2013 | Choi | H01L 23/528 |
| | | | 257/774 |
| 2014/0098591 A1* | 4/2014 | Chen | G11C 17/16 |
| | | | 365/96 |

(Continued)

FOREIGN PATENT DOCUMENTS

| | | | | |
|---|---|---|---|---|
| CN | 211208446 U | * | 8/2020 | ............. G11C 17/16 |
| CN | 115188765 A | * | 10/2022 | ............. H10B 20/20 |

*Primary Examiner* — Huan Hoang
*Assistant Examiner* — Daniel J King
(74) *Attorney, Agent, or Firm* — JCIPRNET

(57) ABSTRACT

Provided is an anti-fuse memory including a anti-fuse memory cell including an isolation structure, a select gate, first and second gate insulating layers, an anti-fuse gate, and first, second and third doped regions. The isolation structure is disposed in a substrate. The select gate is disposed on the substrate. The first gate insulating layer is disposed between the select gate and the substrate. The anti-fuse gate is disposed on the substrate and partially overlapped with the isolation structure. The second gate insulating layer is disposed between the anti-fuse gate and the substrate. The first doped region and the second doped region are disposed in the substrate at opposite sides of the select gate, respectively, wherein the first doped region is located between the select gate and the anti-fuse gate. The third doped region is disposed in the substrate and located between the first doped region and the isolation structure.

19 Claims, 7 Drawing Sheets

(56) References Cited

U.S. PATENT DOCUMENTS

2016/0078962 A1* 3/2016 Park .................. H01L 23/5252
　　　　　　　　　　　　　　　　　　　365/96

* cited by examiner

ANTI-FUSE MEMORY

CROSS-REFERENCE TO RELATED APPLICATION

This application claims the priority benefit of China application serial no. 202211042656.0, filed on Aug. 29, 2022. The entirety of the above-mentioned patent application is hereby incorporated by reference herein and made a part of this specification.

BACKGROUND

Technical Field

The present invention relates to a semiconductor device, and particularly to an anti-fuse memory.

Description of Related Art

An anti-fuse memory is a one-time programmable read-only memory (OTPROM) widely used in personal computers and electronic equipment. During the operation of the anti-fuse memory, an anti-fuse layer is broken down (burned out at a high temperature) by applying a voltage to make current flow through the anti-fuse layer to form a conductive path. In addition, as the integration of memory devices continues to increase, memory devices are developed towards faster speed and smaller sizes. However, as the line width of the memory device continues to shrink, it often leads to leakage current in the memory cell, thus affecting the performance of the memory device.

SUMMARY

The present invention provides an anti-fuse memory, wherein there is no channel region or other regions between the doped region located under the anti-fuse gate as a lightly-doped drain (LDD) region and the isolation structure.

The anti-fuse memory of the present invention includes at least one anti-fuse memory cell. The anti-fuse memory cell includes an isolation structure, a select gate, a first gate insulating layer, an anti-fuse gate, a second gate insulating layer, a first doped region, a second doped region and a third doped region. The isolation structure is disposed in a substrate. The select gate is disposed on the substrate. The first gate insulating layer is disposed between the select gate and the substrate. The anti-fuse gate is disposed on the substrate and partially overlapped with the isolation structure. The second gate insulating layer is disposed between the anti-fuse gate and the substrate. The first doped region and the second doped region are disposed in the substrate at opposite sides of the select gate, respectively, wherein the first doped region is located between the select gate and the anti-fuse gate. The third doped region is disposed in the substrate and located between the first doped region and the isolation structure.

In an embodiment of the anti-fuse memory of the present invention, the third doped region is a lightly doped drain region.

In an embodiment of the anti-fuse memory of the present invention, the third doped region is in contact with the isolation structure.

In an embodiment of the anti-fuse memory of the present invention, a fourth doped region and a fifth doped region are further included, wherein the fourth doped region is disposed in the substrate, below the select gate and connected to the first doped region, and the fifth doped region is disposed in the substrate, below the select gate and connected with the second doped region.

In an embodiment of the anti-fuse memory of the present invention, the overlapping width between the third doped region and the anti-fuse gate is greater than the overlapping width between the fourth doped region and the select gate, and greater than the overlapping width between the fifth doped region and the select gate.

In an embodiment of the anti-fuse memory of the present invention, a contact is further included, wherein the contact is disposed on the second doped region.

In an embodiment of the anti-fuse memory of the present invention, the anti-fuse memory includes two anti-fuse memory cells and a bit line, wherein the two anti-fuse memory cells share the same second doped region and the same contact; the two anti-fuse memory cells are arranged in a mirrored manner with respect to the contact; and the bit line is disposed on the two anti-fuse memory cells and connected with the contact.

In an embodiment of the anti-fuse memory of the present invention, the anti-fuse memory includes a first pair of the anti-fuse memory cells, a second pair of the anti-fuse memory cells and a bit line, wherein in each of the first pair and the second pair, two anti-fuse memory cells share the same second doped region and the same contact, and the two anti-fuse memory cells are arranged in a mirrored manner with respect to the contact; the bit line is disposed on the first pair and the second pair and connected with the contact corresponding to the first pair and the contact corresponding to the second pair; and in an extending direction of the bit line, one of the anti-fuse gates in the first pair is adjacent to one of the anti-fuse gates in the second pair.

In an embodiment of the anti-fuse memory of the present invention, the anti-fuse memory includes a first pair of the anti-fuse memory cells, a second pair of the anti-fuse memory cells, a first bit line and a second bit line, wherein in each of the first pair and the second pair, two anti-fuse memory cells share the same second doped region and the same contact, and the two anti-fuse memory cells are arranged in a mirrored manner with respect to the contact; the first pair and the second pair share the same anti-fuse gate; the first bit line and the second bit line are disposed on the first pair and the second pair; the first bit line is connected with the contact corresponding to the first pair; and the second bit line is connected with the contact corresponding to the second pair.

In an embodiment of the anti-fuse memory of the present invention, the first bit line and the second bit line are located at different levels.

In an embodiment of the anti-fuse memory of the present invention, the first bit line and the second bit line are at the same level.

In an embodiment of the anti-fuse memory of the present invention, the third doped region is partially overlapped with the anti-fuse gate.

In an embodiment of the anti-fuse memory of the present invention, when a programming operation is performed on an anti-fuse transistor including the anti-fuse gate, the second gate insulating layer between the anti-fuse gate and the third doped region is broken down to form a break down region so that current flows from the anti-fuse gate to the third doped region through the break down region.

In an embodiment of the anti-fuse memory of the present invention, the select gate and the anti-fuse gate have the same width.

In an embodiment of the anti-fuse memory of the present invention, the width of the anti-fuse gate is greater than the width of the select gate.

In an embodiment of the anti-fuse memory of the present invention, the fourth doped region and the fifth doped region are lightly doped drain regions.

In an embodiment of the anti-fuse memory of the present invention, the select gate includes a polysilicon gate.

In an embodiment of the anti-fuse memory of the present invention, the anti-fuse gate includes a polysilicon gate.

In an embodiment of the anti-fuse memory of the present invention, the second gate insulating layer includes a silicon oxide layer, a $HfO_2$ layer or an $Al_2O_3$ layer.

In an embodiment of the anti-fuse memory of the present invention, the first gate insulating layer is different from the second gate insulating layer.

Based on the above, in the anti-fuse memory of the present invention, there is no channel region or other regions between the third doped region and the isolation structure. Therefore, during the programming operation of the anti-fuse memory, by causing the second gate insulating layer under the anti-fuse gate to break down (burn out at a high temperature) to form a conductive path, the leakage current may be avoided. In addition, since there is no channel region or other regions between the third doped region and the isolation structure, the formation of the parasitic diode at the channel region during the programming operation, resulting in an increase in the threshold voltage (Vt), may be avoided, and the increase in the threshold voltage due to the halo implant region or the pocket implant region may also be avoided.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
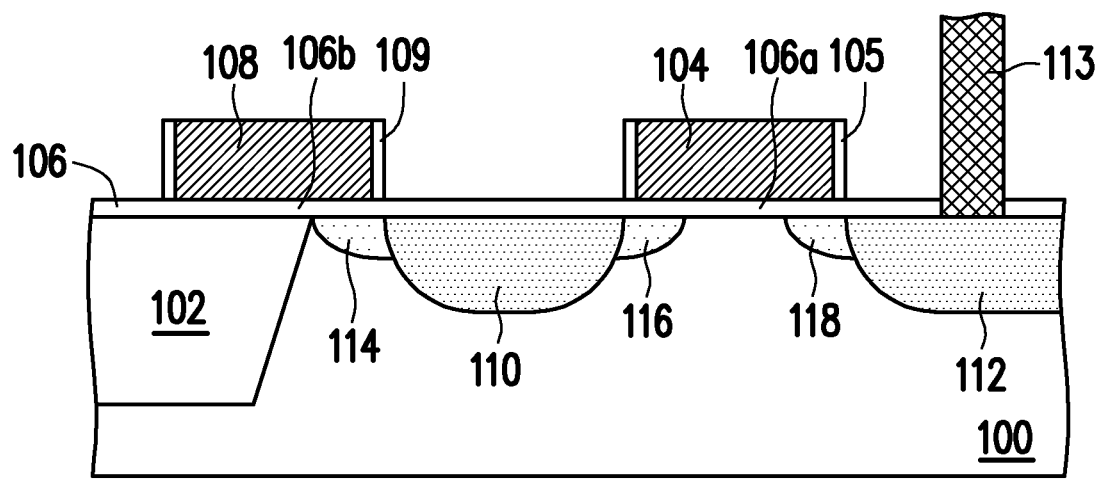
FIG. 1A is a schematic cross-sectional view of an anti-fuse memory cell in an anti-fuse memory of the first embodiment of the present invention.

The embodiments are described in detail below with reference to the accompanying drawings, but the embodiments are not intended to limit the scope of the present invention. In addition, the drawings are for illustrative purposes only and are not drawn to the original dimensions. For the sake of easy understanding, the same elements in the following description will be denoted by the same reference numerals.

In the text, the terms mentioned in the text, such as "comprising", "including", "containing" and "having" are all open-ended terms, i.e., meaning "including but not limited to".

When using terms such as "first" and "second" to describe elements, it is only used to distinguish the elements from each other, and does not limit the order or importance of the devices. Therefore, in some cases, the first element may also be called the second element, the second element may also be called the first element, and this is not beyond the scope of the present invention.

Figure 1B:
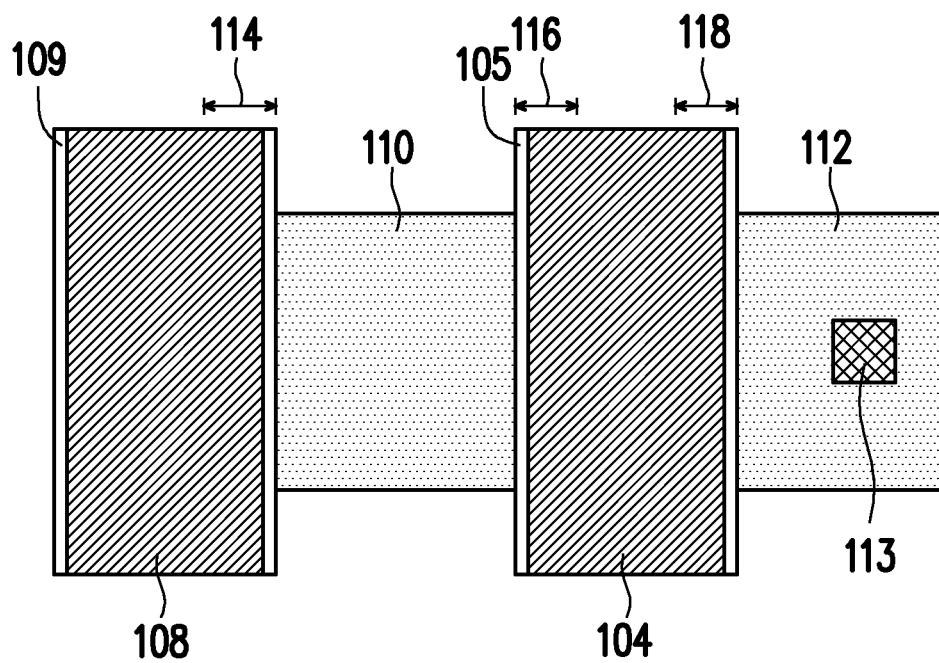
FIG. 1B is a layout diagram of the anti-fuse memory cell in FIG. 1A.

In addition, the directional terms, such as "on", "above", "under" and "below" mentioned in the text are only used to refer to the direction of the drawings, and are not used to limit the present invention FIG. 1A is a schematic cross-sectional view of an anti-fuse memory cell in an anti-fuse memory of the first embodiment of the present invention. FIG. 1B is a layout diagram of the anti-fuse memory cell in FIG. 1A.

Referring to FIGS. 1A and 1B, in the present embodiment, an anti-fuse memory includes an anti-fuse memory cell 10. The anti-fuse memory cell 10 includes a substrate 100, an isolation structure 102, a select gate 104, a first gate insulating layer 106a, an anti-fuse gate 108, a second gate insulating layer 106b, a first doped region 110, a second doped region 112 and a third doped region 114.

In the present embodiment, the substrate 100 may be a silicon substrate having a first conductive type. When the first conductive type is p-type, the second conductive type is n-type. Conversely, when the first conductive type is n-type, the second conductive type is p-type. The isolation structure 102 is disposed in the substrate 100 to define an active area (AA). As known to a person skilled in the art, the isolation structure 102 may be a shallow trench isolation (STI) structure or a field oxide (FOX) layer. The select gate 104 is disposed on the substrate 100. The select gate 104 may be a polysilicon gate. The anti-fuse gate 108 is disposed on the substrate 100 and is partially overlapped with the isolation structure 102. That is, in the present embodiment, a part of the anti-fuse gate 108 is located above the substrate 100, and another part of the anti-fuse gate 108 is located above the isolation structure 102. The anti-fuse gate 108 may be a polysilicon gate.

In the present embodiment, the dielectric layer 106 is continuously disposed on the substrate 100 and the isolation structure 102. The dielectric layer 106 may be a silicon oxide layer or other dielectric layers with high dielectric constant, such as a $HfO_2$ layer, an $Al_2O_3$ layer, and the like. The dielectric layer 106 located between the select gate 104 and the substrate 100 may be used as the gate insulating layer of the select gate 104, that is, the first gate insulating layer 106a. The dielectric layer 106 located between the anti-fuse gate 108 and the substrate 100 may be used as the gate insulating layer of the anti-fuse gate 108, that is, the second gate insulating layer 106b. That is, in the present embodiment, the first gate insulating layer 106a and the second gate insulating layer 106b are the same dielectric layer, but the present invention is not limited thereto. In other embodiments, the first gate insulating layer 106a and the second gate insulating layer 106b may be different dielectric layers according to actual needs. For example, the first gate insulating layer 106a and the second gate insulating layer 106b may be different in material, or the first gate insulating layer 106a and the second gate insulating layer 106b may be different in thickness. In addition, in the present embodiment, spacers 105 are disposed on the sidewalls of the select gate 104, and spacers 109 are disposed on the sidewalls of the anti-fuse gate 108, but the present invention is not limited thereto.

The first doped region 110 and the second doped region 112 are respectively disposed in the substrate 100 at opposite sides of the select gate 104. The first doped region 110 and the second doped region 112 have an opposite conductive type to that of the substrate 100, that is, the first doped region 110 and the second doped region 112 have a second conductive type. The first doped region 110 is located between the select gate 104 and the anti-fuse gate 108. In addition, in the present embodiment, the anti-fuse memory cell 10 further includes a contact 113 disposed on the second doped region 112 and connected to the second doped region 112 penetrating through the dielectric layer 106. The contact 113 is used to electrically connect the anti-fuse memory cell 10 with a bit line (not shown) in the anti-fuse memory. Therefore, in the present embodiment, the first doped region 110 may be used as a source, and the second doped region 112 may be used as a drain.

The third doped region 114 is disposed in the substrate 100 between the first doped region 110 and the isolation structure 102. The third doped region 114 is partially overlapped with the anti-fuse gate 108. The third doped region 114 has an opposite conductive type to that of the substrate 100, that is, the third doped region 114 has the second conductive type. In addition, in the present embodiment, the third doped region 114 is used as a lightly doped drain region. Therefore, the doping concentration of the third doped region 114 is less than the doping concentration of the first doped region 110 and less than the doping concentration of the second doped region 112.

In addition, in the present embodiment, the anti-fuse memory cell 10 further includes a fourth doped region 116 and a fifth doped region 118. The fourth doped region 116 is disposed in the substrate 100 below the select gate 104 and connected to the first doped region 110. The fifth doped region 118 is disposed in the substrate 100 below the select gate 104 and connected to the second doped region 112. The fourth doped region 116 and the fifth doped region 118 have an opposite conductive type to that of the substrate 100, that is, the fourth doped region 116 and the fifth doped region 118 have the second conductive type. The region between the fourth doped region 116 and the fifth doped region 118 is the channel region of the select transistor including the select gate 104. In addition, in the present embodiment, the fourth doped region 116 and the fifth doped region 118 are lightly doped drain regions. Therefore, the doping concentration of the fourth doped region 116 and the doping concentration of the fifth doped region 118 are less than the doping concentration of the first doped region 110 and less than the doping concentration of the second doped region 112.

In addition, in the present embodiment, the third doped region 114 is in contact with the isolation structure 102. That is, in the transistor including the anti-fuse gate 108, there is no channel region, such as the region between the fourth doped region 116 and the fifth doped region 118, or other regions such as the halo implant region or the pocket implant region well known to a person skilled in the art.

In the anti-fuse memory cell 10 of the present embodiment, since the third doped region 114 is in contact with the isolation structure 102, there is no channel region or other regions between the third doped region 114 and the isolation structure 102. In addition, the anti-fuse gate 108 and the second gate insulating layer 106b constitute an anti-fuse structure. In this way, during the programming operation of the anti-fuse memory cell 10, a break down region (conductive path) is formed by causing the second gate insulating layer 106b under the anti-fuse gate 108 to break down (burn out at a high temperature), and thus the leakage current may be effectively avoided. In other words, in the present embodiment, current only flows from the anti-fuse gate 108 to the third doped region 114 through the break down region. In addition, since there is no channel region or other regions between the third doped region 114 and the isolation structure 102, the increase of threshold voltage caused by the formation of parasitic diode at the channel region during the programming operation may be avoided, and the increase of threshold voltage caused by the halo implant region or the pocket implant region may also be avoided.

In addition, in order to further enhance the effects brought by the third doped region 114, in the present embodiment, the overlapping width between the third doped region 114 and the anti-fuse gate 108 is greater than the overlapping width between the fourth doped region 116 and the select gate 104, and greater than the overlapping width between the fifth doped region 118 and the select gate 104, but the present invention is not limited thereto. In other embodiments, depending on actual needs, the overlapping width between the third doped region 114 and the anti-fuse gate 108 may be the same as the overlapping width between the fourth doped region 116 and the select gate 104 and the overlapping width between the fifth doped region 118 and the select gate 104.

In addition, in the present embodiment, the select gate 104 and the anti-fuse gate 108 have the same width, but the present invention is not limited thereto. In other embodiments, the select gate 104 and the anti-fuse gate 108 may have different widths. For example, in an embodiment, the width of the anti-fuse gate 108 may preferably be greater than the width of the select gate 104.

The programming operation and the reading operation of the anti-fuse memory cell 10 of the present embodiment are exemplarily described below, but the present invention is not limited thereto.

Figure 6A:
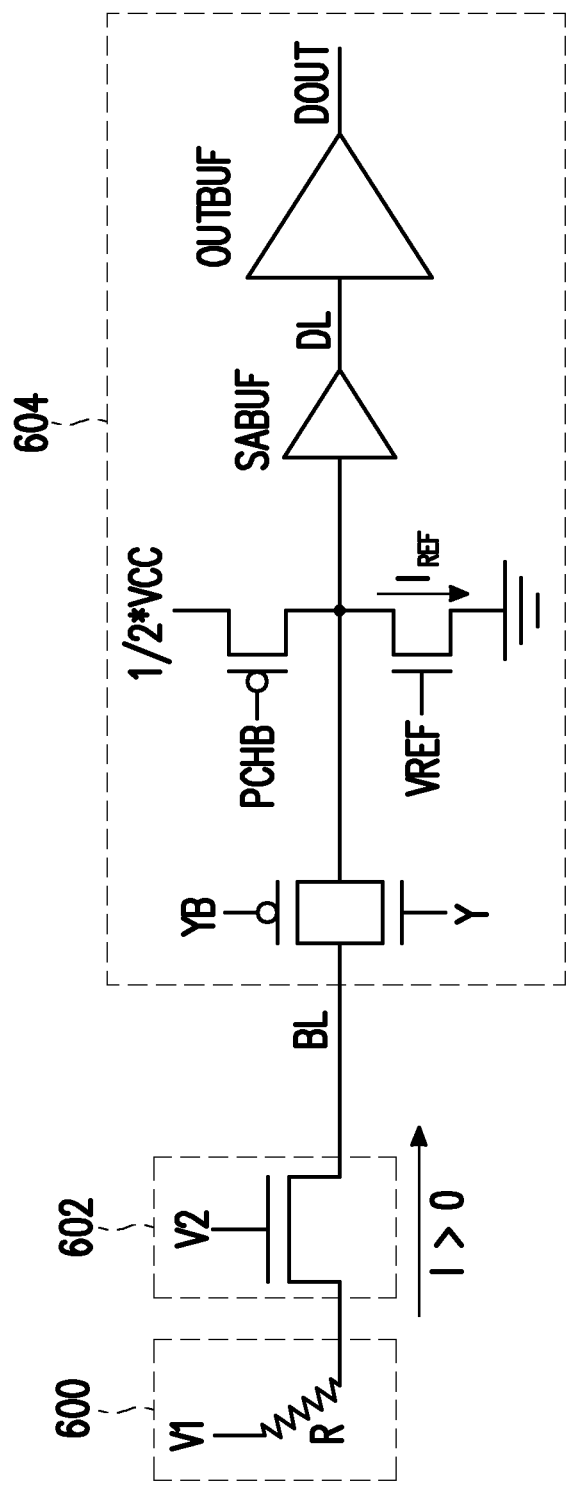
FIGS. 6A and 6B are equivalent circuit diagrams of the anti-fuse memory of the first embodiment of the present invention when the reading operation is performed.
Figure 6B:
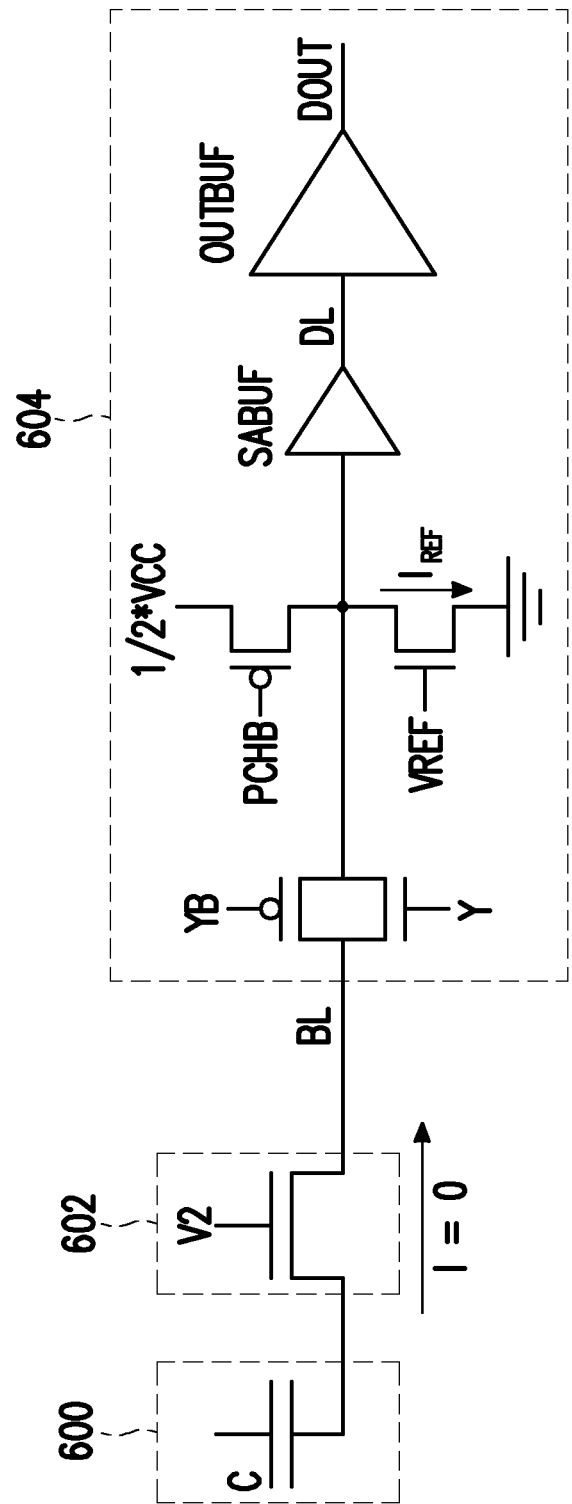

A voltage of about 7.0 V is applied to the anti-fuse gate 108 and a voltage of about 3.0 V is applied to the select gate 104 to perform a programming operation on the anti-fuse memory cell 10. At this time, the second gate insulating layer 106b between the anti-fuse gate 108 and the third doped region 114 is broken down (burned out at a high temperature) to form a conductive path with a resistance value of 0. After the programming operation, a reading operation may be performed on the anti-fuse memory cell 10. As shown in FIGS. 6A and 6B, a voltage V1 of about 2.5 V is applied to the anti-fuse gate 108 of the anti-fuse transistor 600, and a voltage V2 of about 1.4 V is applied to the select gate 104 of the select transistor 602. In addition, the contact 113 may be connected to the external read circuit 604 through the bit line BL. The readout circuit 604 includes various devices that are well known and are not limited by the present invention. For example, in the present embodiment, the read circuit 604 may include a device for processing column select signals Y and YB; a device for pre-charging to half of the supply voltage VCC according to the pre-charge signal PCHB and the reference voltage VREF, wherein the reference current IREF is generated; a sense amplifier buffer SABUF for generating the data line signal DL; an output buffer OUTBUF for generating the data output signal DOUT. At this time, a voltage of about 1.4 V may be applied to the bit line BL (the contact 113) via the external reading circuit 604 for pre-charging. Therefore, as shown in FIG. 6A, when the anti-fuse memory cell 10 has been programmed, the current I flowing through the select gate 104 is greater than 0, the voltage at the bit line BL may be pulled up to about 0.8 V, and the data of "1" may be read. In addition, as shown in FIG. 6B, when the anti-fuse memory cell 10 is not programmed, the current I flowing through the select gate 104 is 0, the voltage at the bit line BL may be pulled down to about 0 V, and the data of "0" may be read. In this way, the electrical signal of the anti-fuse memory cell 10 may be read.

Figure 2:
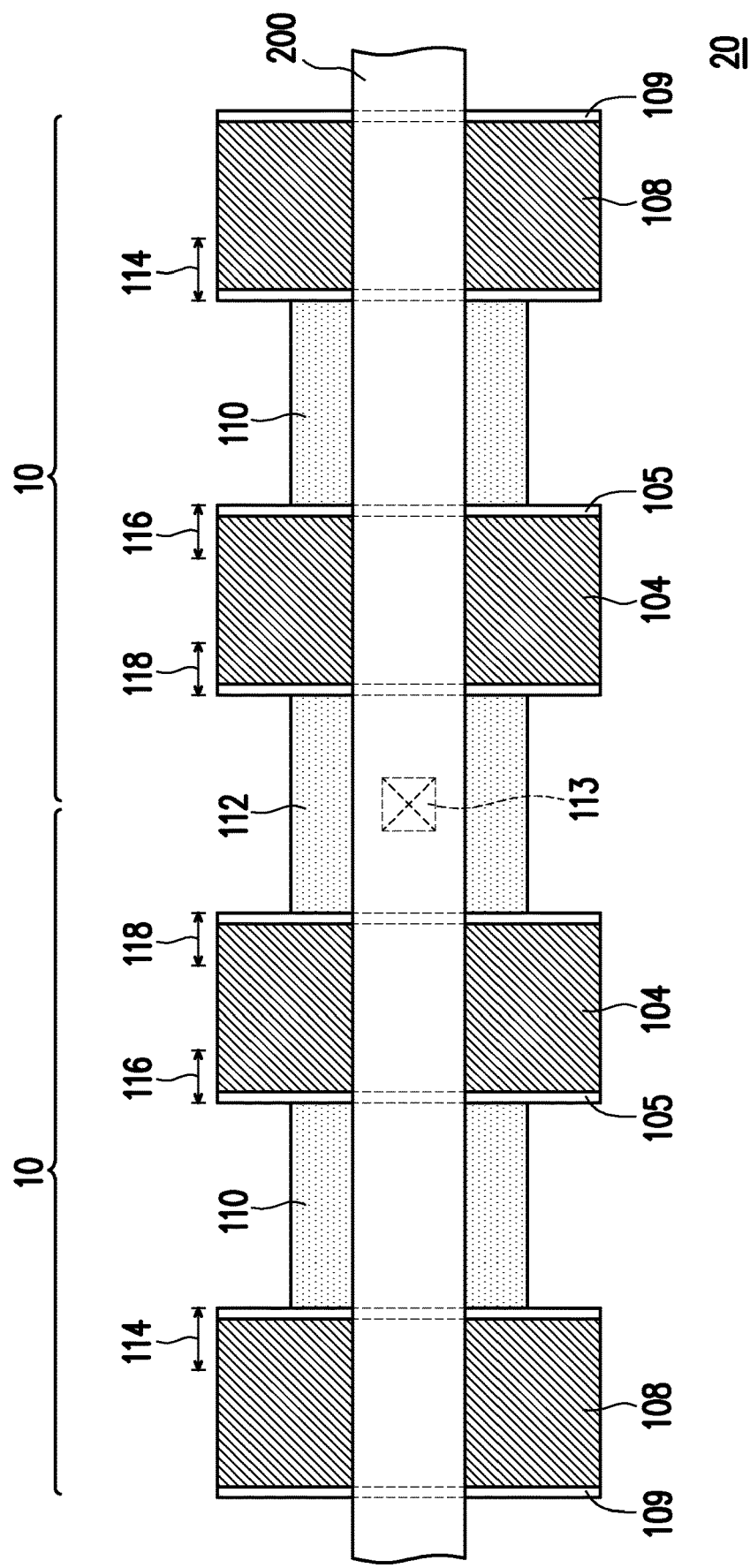
FIG. 2 is a layout diagram of an anti-fuse memory of the second embodiment of the present invention.

FIG. 2 is a layout diagram of an anti-fuse memory of the second embodiment of the present invention. In the present embodiment, the same devices as those in FIGS. 1A and 1B will be denoted by the same reference numbers and will not be described again.

Referring to FIG. 2, an anti-fuse memory 20 of the present embodiment includes two anti-fuse memory cells 10 and a bit line 200. In detail, in the anti-fuse memory 20, two anti-fuse memory cells 10 share one second doped region 112 and one contact 113. The two anti-fuse memory cells 10 are arranged in a mirrored manner with respect to the contact 113. In addition, the bit line 200 is disposed on the two anti-fuse memory cells 10 and connected with the contact 113. In this way, a voltage may be simultaneously applied to the second doped regions 112 in the two anti-fuse memory cells 10 through the bit line 200. In addition, in the present embodiment, the extending direction of the bit line 200 is the same as the connection direction of the two anti-fuse memory cells 10, so the layout area of the anti-fuse memory 20 may be effectively reduced.

Figure 3:
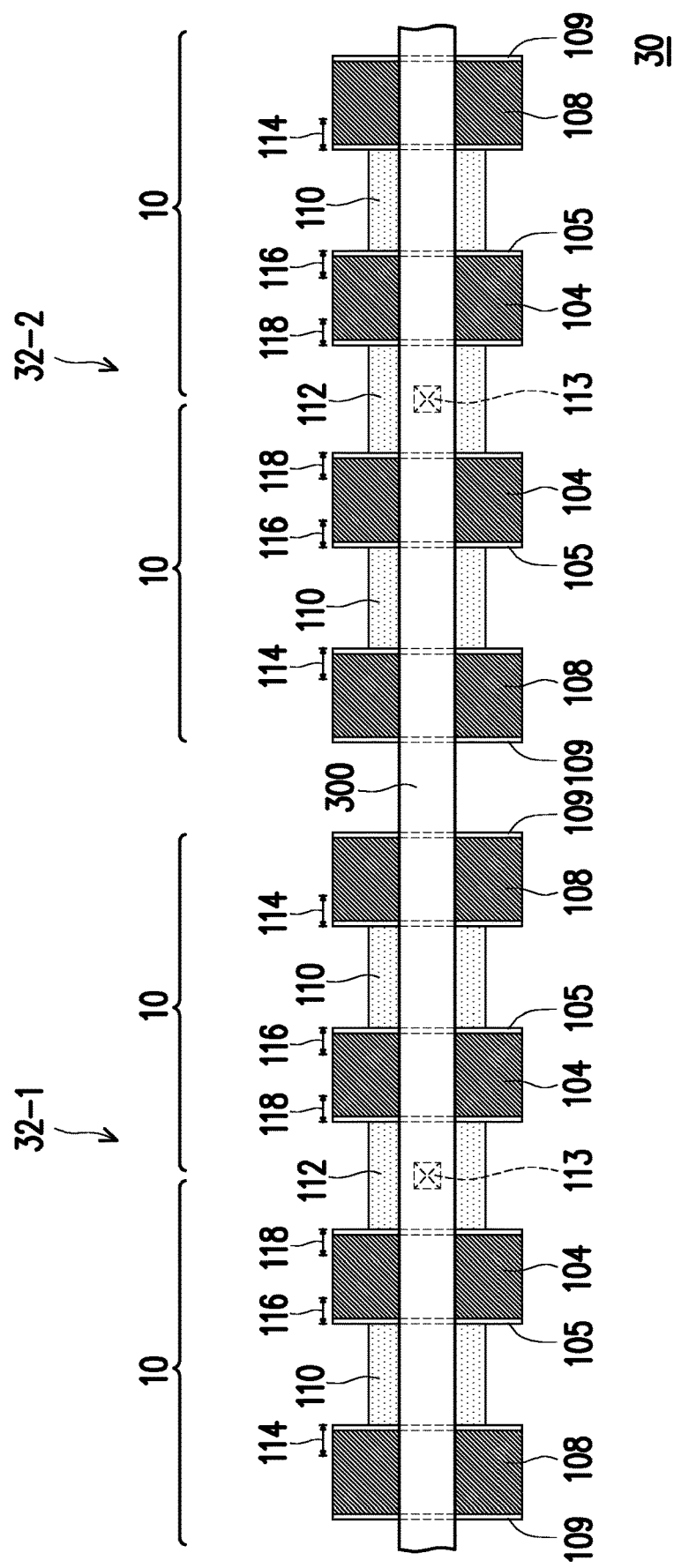
FIG. 3 is a layout diagram of an anti-fuse memory of the third embodiment of the present invention.

FIG. 3 is a layout diagram of an anti-fuse memory of the third embodiment of the present invention. In the present embodiment, the same devices as those in FIGS. 1A, 1B and 2 will be denoted by the same reference numbers and will not be described again.

Referring to FIG. 3, an anti-fuse memory 30 of the present embodiment includes a first pair 32-1 of the anti-fuse memory cells 10, a second pair 32-2 of the anti-fuse memory cells 10 and a bit line 300. In detail, in the anti-fuse memory 30, the first pair 32-1 of the anti-fuse memory cells 10 and the second pair 32-2 of the anti-fuse memory cells 10 each have a configuration as shown in FIG. 2. That is, in the first pair 32-1 of the anti-fuse memory cells 10, the two anti-fuse memory cells 10 share one second doped region 112 and one contact 113, and the two anti-fuse memory cells 10 are arranged in a mirrored manner with respect to the contact 113; in the second pair 32-2 of the anti-fuse memory cells 10, the two anti-fuse memory cells 10 share one second doped region 112 and one contact 113, and the two anti-fuse memory cells 10 are arranged in a mirrored manner with respect to the contact 113. In addition, in the present embodiment, the first pair 32-1 of the anti-fuse memory cells 10 is not connected to the second pair 32-2 of the anti-fuse memory cells 10.

In addition, the bit line 300 is disposed on the first pair 32-1 of the anti-fuse memory cells 10 of and the second pair 32-2 of the anti-fuse memory cells 10, and is connected with both the contact 113 corresponding to the first pair 32-1 and the contact 113 corresponding to the second pair 32-2. In the extending direction of the bit line 300, one anti-fuse gate 108 in the first pair 32-1 is adjacent to one anti-fuse gate 108 in the second pair 32-2. In this way, a voltage may be applied simultaneously to the second doped regions 112 in the first pair 32-1 of the anti-fuse memory cells 10 and the second pair 32-2 of the anti-fuse memory cells 10 through the bit line 300. In addition, in the present embodiment, the extending direction of the bit line 300 is the same as the arrangement direction of the first pair 32-1 of the anti-fuse memory cells and the second pair 32-2 of the anti-fuse memory cells 10, so the layout area of the anti-fuse fuse memory 30 may be effectively reduced.

In the present embodiment, the anti-fuse memory 30 includes two pairs of anti-fuse memory cells 10, but the present invention is not limited thereto. In other embodiments, depending on the actual needs, the same method may be used to set the bit lines on more pairs of anti-fuse memory cells 10, and connect the bit lines to the contacts corresponding to each pair at the same time.

Figure 4:
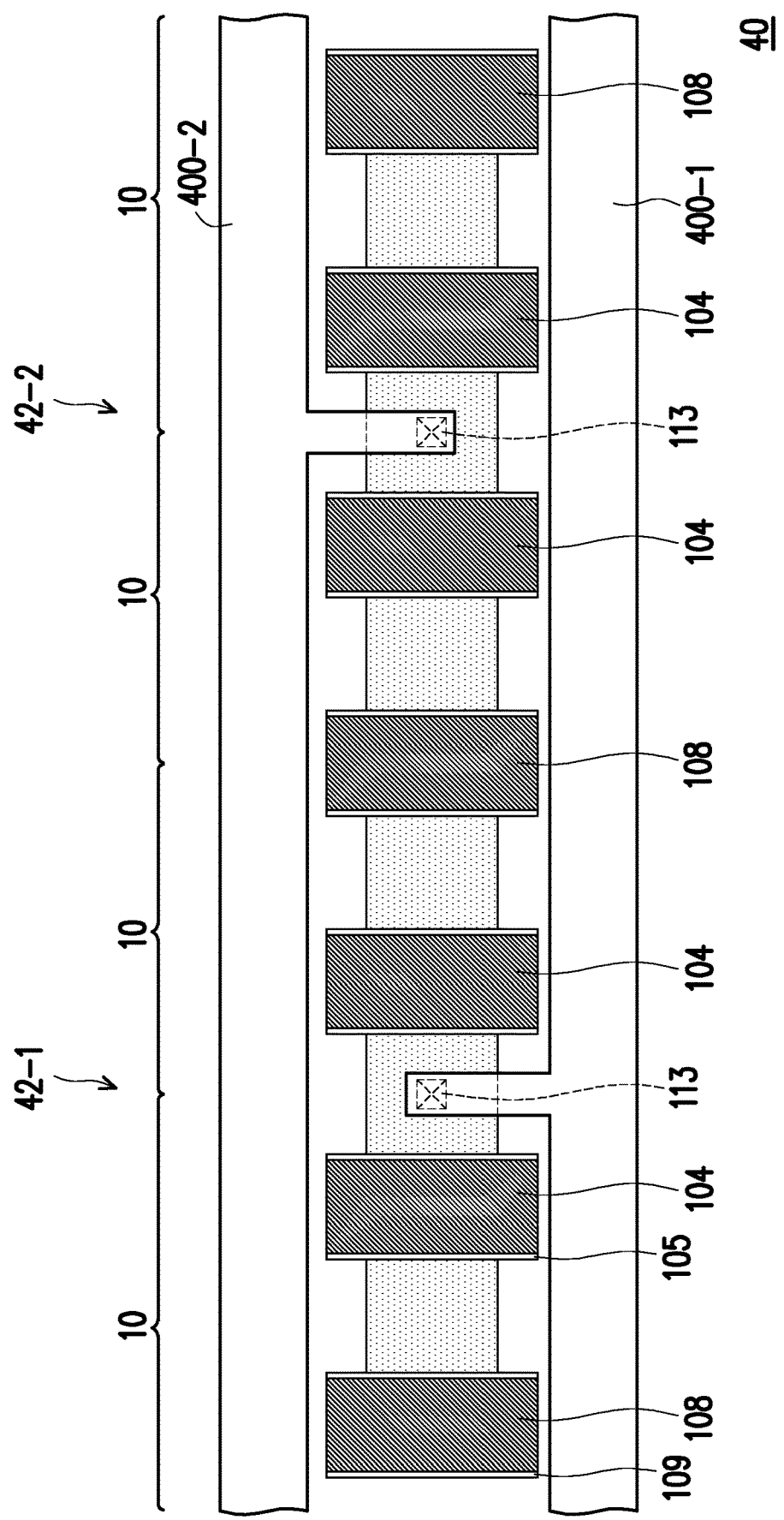
FIG. 4 is a layout diagram of the anti-fuse memory of the fourth embodiment of the present invention.

FIG. 4 is a layout diagram of the anti-fuse memory of the fourth embodiment of the present invention. In the present embodiment, the same devices as those in FIGS. 1A, 1B and 2 will be denoted by the same reference numbers and will not be described again.

Referring to FIG. 4, an anti-fuse memory 40 of the present embodiment includes a first pair 42-1 of the anti-fuse memory cells 10, a second pair 42-2 of the anti-fuse memory cells 10, a first bit line 400-1 and a second bit line 400-2. In the anti-fuse memory 40, the first pair 42-1 of the anti-fuse memory cells 10 and the second pair 42-2 of the anti-fuse memory cells 10 each have a configuration as shown in FIG. 2. That is, in the first pair 42-1 of the anti-fuse memory cells 10, the two anti-fuse memory cells 10 share one second doped region 112 and one contact 113, and the two anti-fuse memory cells 10 are arranged in a mirrored manner with respect to the contact 113; in the second pair 42-2 of the anti-fuse memory cells 10, the two anti-fuse memory cells 10 share one second doped region 112 and one contact 113, and the two anti-fuse memory cells 10 are arranged in a mirrored manner with respect to the contact 113. In addition, the first pair of 42-1 of the anti-fuse memory cells 10 and the second pair of 42-2 of the anti-fuse memory cells 10 share one anti-fuse gate 108, that is, the first pair of 42-1 of the anti-fuse memory cells 10 and the second pair of 42-2 of the anti-fuse memory cells 10 are connected with each other.

In addition, in the present embodiment, the first bit line 400-1 and the second bit line 400-2 are disposed on the first pair of 42-1 of the anti-fuse memory cells 10 and the second pair of 42-2 of the anti-fuse memory cells 10. The first bit line 400-1 is connected with the contact 113 corresponding to the first pair 42-1, and the second bit line 400-2 is connected with the contact 113 corresponding to the second pair 42-2. That is, in the present embodiment, a voltage may be applied independently to the second doped region 112 in the first pair of 42-1 of the anti-fuse memory cells 10 through the first bit line 400-1, and a voltage may be applied independently to the second pair of 42-2 of the anti-fuse memory cells 10 through the second bit line 400-2 to operate the two pairs of anti-fuse memory cells 10 independently.

In addition, in the present embodiment, from the top view, the first bit line 400-1 and the second bit line 400-2 are extended in parallel at opposite sides of the anti-fuse memory cells 10 respectively, so the first bit line 400-1 and the second bit line 400-2 may be arranged at the same level, that is, the first bit line 400-1 and the second bit line 400-2 may be disposed in the same layer, but the present invention is not limited thereto. In other embodiments, the first bit line 400-1 and the second bit line 400-2 may be disposed at different levels according to actual needs.

Figure 5:
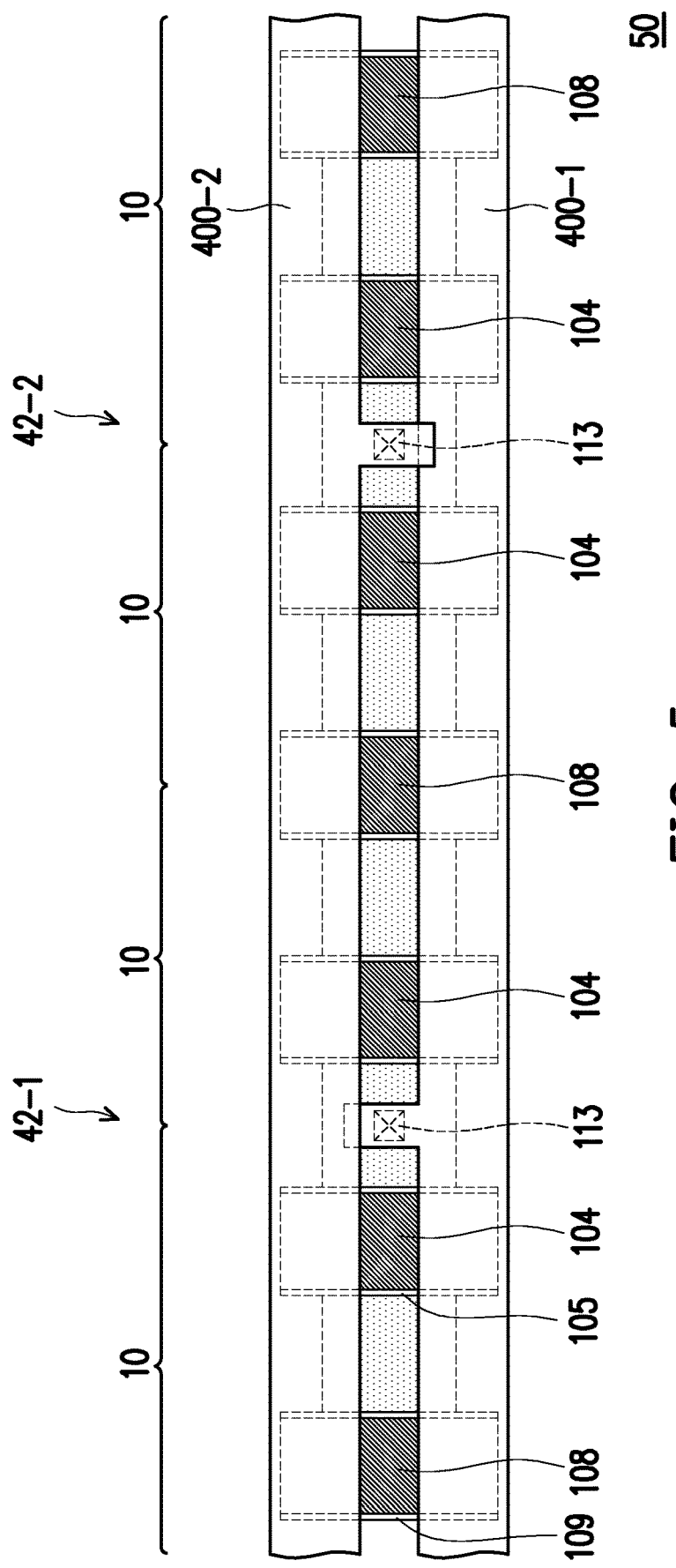
FIG. 5 is a layout diagram of the anti-fuse memory of the fifth embodiment of the present invention.

FIG. 5 is a layout diagram of the anti-fuse memory of the fifth embodiment of the present invention. In the present embodiment, the same devices as those in FIG. 4 will be denoted by the same reference numbers and will not be described again.

Referring to FIG. 5, the difference between an anti-fuse memory 50 of the present embodiment and the anti-fuse memory 40 is that: in the anti-fuse memory 50, the second bit line 400-2 is disposed at a higher level than the first bit line 400-1, that is, the first bit line 400-1 and the second bit line 400-2 are disposed in different layers. In this way, the layout area of the anti-fuse memory may be effectively reduced.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An anti-fuse memory, comprising:
   at least one anti-fuse memory cell, wherein the anti-fuse memory cell comprises:
   an isolation structure, disposed in a substrate;
   a select gate, disposed on the substrate;
   a first gate insulating layer, disposed between the select gate and the substrate;
   an anti-fuse gate, disposed on the substrate and partially overlapped with the isolation structure;
   a second gate insulating layer, disposed between the anti-fuse gate and the substrate;
   a first doped region and a second doped region, disposed in the substrate at opposite sides of the select gate, respectively, wherein the first doped region is located between the select gate and the anti-fuse gate; and
   a third doped region, disposed in the substrate and located between the first doped region and the isolation structure,
   wherein the third doped region is in contact with the first doped region and the isolation structure.

2. The anti-fuse memory of claim 1, wherein the third doped region is a lightly doped drain region.

3. The anti-fuse memory of claim 1, further comprising a fourth doped region and a fifth doped region, wherein the fourth doped region is disposed in the substrate, below the select gate and connected to the first doped region, and the fifth doped region is disposed in the substrate, below the select gate and connected with the second doped region.

4. The anti-fuse memory of claim 3, wherein the overlapping width between the third doped region and the anti-fuse gate is greater than the overlapping width between the fourth doped region and the select gate, and greater than the overlapping width between the fifth doped region and the select gate.

5. The anti-fuse memory of claim 1, further comprising a contact disposed on the second doped region.

6. The anti-fuse memory of claim 5, comprising two anti-fuse memory cells and a bit line, wherein:
   the two anti-fuse memory cells share the same second doped region and the same contact,
   the two anti-fuse memory cells are arranged in a mirrored manner with respect to the contact, and
   the bit line is disposed on the two anti-fuse memory cells and connected with the contact.

7. The anti-fuse memory of claim 5, comprising a first pair of the anti-fuse memory cells, a second pair of the anti-fuse memory cells and a bit line, wherein:
   in each of the first pair and the second pair, two anti-fuse memory cells share the same second doped region and the same contact, and the two anti-fuse memory cells are arranged in a mirrored manner with respect to the contact,
   the bit line is disposed on the first pair and the second pair and connected with the contact corresponding to the first pair and the contact corresponding to the second pair, and
   in an extending direction of the bit line, one of the anti-fuse gates in the first pair is adjacent to one of the anti-fuse gates in the second pair.

8. The anti-fuse memory of claim 5, comprising a first pair of the anti-fuse memory cells, a second pair of the anti-fuse memory cells, a first bit line and a second bit line, wherein:
   in each of the first pair and the second pair, two anti-fuse memory cells share the same second doped region and the same contact, and the two anti-fuse memory cells are arranged in a mirrored manner with respect to the contact,
   the first pair and the second pair share the same anti-fuse gate,
   the first bit line and the second bit line are disposed on the first pair and the second pair,
   the first bit line is connected with the contact corresponding to the first pair, and
   the second bit line is connected with the contact corresponding to the second pair.

9. The anti-fuse memory of claim 8, wherein the first bit line and the second bit line are located at different levels.

10. The anti-fuse memory of claim 8, wherein the first bit line and the second bit line are at the same level.

11. The anti-fuse memory of claim 1, wherein the third doped region is partially overlapped with the anti-fuse gate.

12. The anti-fuse memory of claim 1, wherein when a programming operation is performed on an anti-fuse transistor comprising the anti-fuse gate, the second gate insulating layer between the anti-fuse gate and the third doped region is broken down to form a break down region so that current flows from the anti-fuse gate to the third doped region through the break down region.

13. The anti-fuse memory of claim 1, wherein the select gate and the anti-fuse gate have the same width.

14. The anti-fuse memory of claim 1, wherein the width of the anti-fuse gate is greater than the width of the select gate.

15. The anti-fuse memory of claim 1, wherein the fourth doped region and the fifth doped region are lightly doped drain regions.

16. The anti-fuse memory of claim 1, wherein the select gate comprises a polysilicon gate.

17. The anti-fuse memory of claim 1, wherein the anti-fuse gate comprises a polysilicon gate.

18. The anti-fuse memory of claim 1, wherein the second gate insulating layer comprises a silicon oxide layer, a $HfO_2$ layer or an $Al_2O_3$ layer.

19. The anti-fuse memory of claim 1, wherein the first gate insulating layer is different from the second gate insulating layer.

* * * * *